Aug. 1, 1961 G. F. CEROFOLINI 2,994,833
TRANSISTOR TONE GENERATOR AND POWER AMPLIFIER
Filed Feb. 11, 1959 3 Sheets-Sheet 1

INVENTOR.
G. F. Cerofolini
BY C. R. Sipes
Atty.

TRANSISTOR TONE GENERATOR AND POWER AMPLIFIER

Filed Feb. 11, 1959

INVENTOR.
G. F. Cerofolini
BY C. R. Sipe
Atty.

Aug. 1, 1961 G. F. CEROFOLINI 2,994,833

TRANSISTOR TONE GENERATOR AND POWER AMPLIFIER

Filed Feb. 11, 1959 3 Sheets-Sheet 3

INVENTOR.
G. F. Cerofolini
BY C. R. Sipe
Atty.

United States Patent Office 2,994,833

Patented Aug. 1, 1961

2,994,833

TRANSISTOR TONE GENERATOR AND POWER AMPLIFIER

Gabriele F. Cerofolini, Milan, Italy, assignor to Automatic Electric Laboratories, Inc., a corporation of Delaware Filed Feb. 11, 1959, Ser. No. 792,650

9 Claims. (Cl. 330—18)

This invention relates to a transistor tone generator and power amplifier, and more particularly to an arrangement for producing a modulated tone such as is required in a telephone exchange.

The principal object of this invention is to provide an improved tone generator and power amplifier, with good efficiency, operated from a direct current power source which has a voltage substantially higher than the inverse voltage rating of the transistors.

Another object is to provide an amplifier in which transistors operated in parallel contribute substantially equal output signal power, even though the gains of the individual transistors may differ from each other.

Transistor power amplifiers which are operated from a direct current supply voltage substantially higher than the voltage rating of the transistors require voltage dropping resistors which must dissipate considerable amounts of power, thereby substantially reducing the efficiency of the amplifier. Also, when transistors are operated in parallel to increase the power capability of an amplifier, some of the transistors may deliver substantially more power than others because of differences in the gain characteristics of the transistors.

According to the invention, a power amplifier is provided comprising two or more transistors transformer-coupled to a load, the transformer having a separate primary winding associated with each transistor, the emitter-collector paths of the transistors and the primary windings of the transformer being connected alternately in series across the direct current power supply. Each transistor has an individual direct current bias arrangement for the base electrode, which may be a voltage divider per transistor connected across the main direct current supply. Thereby, the transistors are connected in series for direct current, and the bias may be adjusted so that they divide the total voltage equally among them. Each transistor effectively supplies its output signal power to the associated primary winding of the transformer, and since these windings are all wound on the same transformer core, the transistors are effectively operated in parallel for A.C. signals.

The base terminals of all of the transistors may be capacitively connected in parallel to the input signal source. In one arrangement the output transformer winding associated with each transistor is connected to its collector electrode, and each emitter electrode is effectively at substantially A.C. ground potential, so that a grounded-emitter amplifier is obtained. In another arrangement the output transformer winding associated with each transistor is connected to its emitter terminal, and the collector terminal of each transistor is effectively at A.C. ground potential, so that an emitter-follower amplifier is obtained.

According to an alternative arrangement of the invention, the input signal source is coupled to the base electrode of only one of the transistors, and each of the other transistors has its base electrode capacitively coupled to ground and obtains its input power from an adjacent transistor.

The above-mentioned and other objects and features of this invention and the manner of obtaining them will become more apparent, and the invention itself will be best understood, by reference to the following description of embodiments of the invention taken in conjunction with the accompanying drawings comprising FIGS. 1 to 4 wherein.

Figure 1:
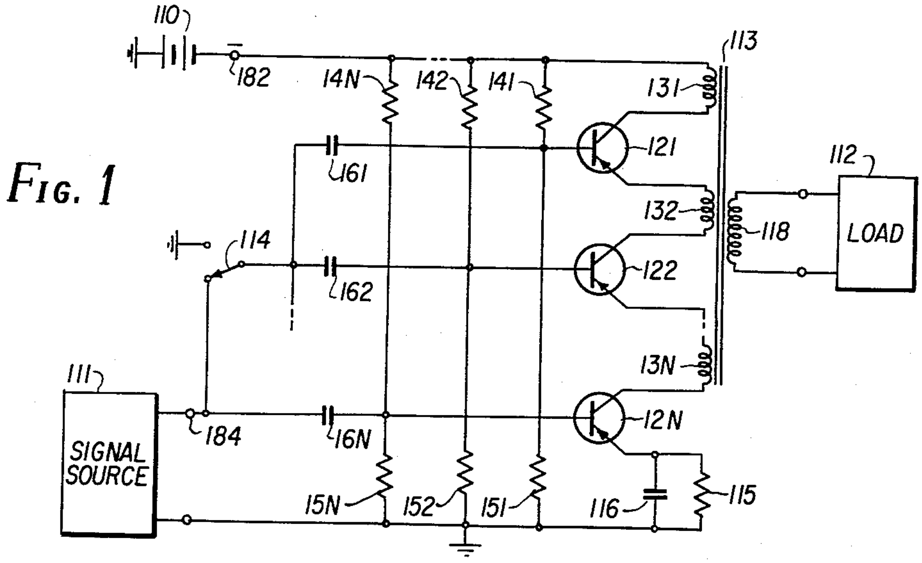
FIGS. 1 and 2 are schematic diagrams of different embodiments of the output amplifier according to the invention.

Referring to FIG. 1, a grounded-emitter transistor power amplifier is shown comprising a plurality of transistors 121 to 12N coupled to a load 112 by an output transformer 113. The transformer has a number of primary windings, 131 to 13N equal to the number of transistors. A secondary winding 118 is connected to the load 112. Each of the transistors has its collector electrode connected to one of the primary windings. Direct current bias power is supplied by a source such as a battery 110 connected between a supply terminal 182 and ground, and having a voltage greater than the inverse breakdown voltage of each of the transistors. The emitter-collector paths of the transistors and the primary windings are connected in series between the supply terminal 182 and ground, so that the first winding 131 is connected between the supply terminal 182 and the collector electrode of the first transistor 121, and each of the other windings is connected between the emitter electrode of one transistor and the collector electrode of the adjacent transistor. A stabilizing resistor 115 is connected between the emitter electrode of the last transistor 12N and ground, and this resistor is bypassed by a condenser 116 to place this emitter electrode at A.C. ground. The base electrode of each transistor is connected to a separate voltage divider for direct current bias, the base electrodes of transistors 121 to 12N being connected respectively through resistors 141 to 14N to terminal 182 and through resistors 151 to 15N to ground. For A.C. signal operation, the respective base electrodes are connected through condensers 161 to 16N. Input signal power is supplied between the terminal 184 and ground by a signal source 111. With the switch 114 in the position shown, each of the coupling condensers 161 to 16N is connected to the terminal 184.

Figure 2:
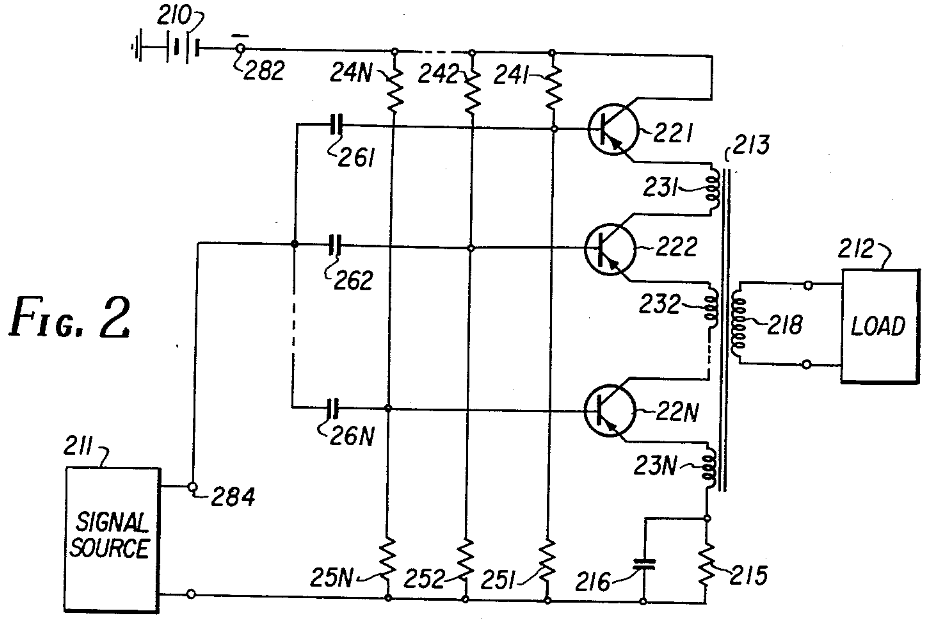

In FIG. 2 a grounded-collector transistor power amplifier is shown which is similar to the circuit of FIG. 1, except for the manner of connecting the primary windings of the output transformer. Transistors 221 to 22N and the primary windings 231 to 23N of output transformer 213 are connected in series between the terminals 282 and ground of a direct current power supply such as battery 210.

The secondary winding 218 of the transformer is connected to a load 212. The base electrodes of the transistors 221 to 22N are connected respectively through resistors 241 to 24N to the terminal 282, and through resistors 251 to 25N to ground. These base electrodes are also connected respectively through coupling condensers 261 to 26N to the terminal 284 of signal source 211. In this embodiment, each transistor has its emitter electrode connected to a primary winding of the output transformer. The winding 23N has one end connected to the emitter electrode of transistor 22N and the other end is connected through the stabilizing resistor 215 to ground for direct current, and through condenser 216 to ground for alternating current. Each of the other primary windings is connected between the emitter electrode of one transistor and the collector electrode of an adjacent transistor.

Transistors of the junction type have a high value of collector current compared to the base current. The ratio of the collector current to the base current is the grounded-emitter current gain, designated Beta. The emitter current is the sum of the collector current and the base current. With the transistors connected in series as shown in FIGS. 1 and 2, the collector current of each transistor must be equal to the emitter current of the preceding transistor above it. For each transistor, if the value of Beta is high, the base current may be considered to be negligible compared to the collector current, and therefore the emitter and collector currents are substantially equal. Considering the entire group of transistors in either circuit, if the total number of transistors is small, and the values of Beta of the individual transistors are high, then all of the transistors will have substantially the same value of collector current. The value of the collector current for the last transistor, 12N or 22N, is determined by the value of its base current, the collector current being equal to the value of Beta for that transistor multiplied by the base current value. Since each of the other transistors has substantially the same value of collector current, each will be constrained to deliver a base current in accordance therewith, which, for each transistor, will be equal to the collector current divided by the value of Beta for that transistor. Therefore, the base current values of the transistors are inversely proportional to the current gain factors Beta. This determination of the values of the various currents flowing in the transistors applies to both the direct current bias current using the static values of Beta, and to the alternating current signal current using the dynamic values of Beta.

For the static analysis, the direct current resistance of the transformer windings is low and may be assumed to be negligible. The collector resistance of each transistor is very high while the base and emitter resistances are very low. In FIG. 1 the value of the direct current bias current of the last transistor 12N is determined by the supply voltage at terminal 182 to ground, the values of the bias resistors 14N and 15N, the static value of Beta for this transistor, and the value of the stabilizing resistor 115. The stabilizing resistor 115 may be considered as a direct current load for this transistor. In like manner, in FIG. 2, the bias current of the transistor 22N is determined by the supply voltage at the terminal 282, the values of resistors 24N and 25N, the static Beta of this transistor, and the stabilizing resistor 215. In each case, the collector-emitter current of each of the other transistors is substantially equal to that of the last transistor. The direct current voltage at the emitter electrode of transistor 12N with respect to ground is equal to the drop across the stabilizing resistor 115. Since the resistance, and therefore the voltage drop between the base and emitter electrodes of each of the transistors, is low, the direct current voltage from the emitter electrode of each of the other transistors to ground is determined by the voltage supplied by its individual voltage divider to its base electrode. As an example, the current flowing through resistor 141 is the sum of the current through resistor 151 and the base current of transistor 121. This current produces a voltage drop in the resistor 141 which, subtracted from the voltage at terminal 182, gives the base-to-ground voltage and therefore substantially the emitter-to-ground voltage of transistor 121. For best use of the circuit, the values of resistors 141 to 14N and 151 to 15N should be so proportioned that each of the transistors 121 to 12N have substantially the same direct current voltage drops between the collector and emitter electrodes. Note that in the determination of all of the bias currents, that the transistor 12N has a direct current load provided by transistor 115 at its emitter electrode, while each of the other transistors sees a current generator as provided by the collector of the succeeding transistor. This factor causes the voltage divider feeding the base electrode of each transistor other than the last to supply the value of base current which is equal to the collector current divided by the static value of Beta. Note also that because of the series connection the sum of the direct current voltage drops across the emitter-collector paths of the transistors plus the voltage drop across the stabilizing resistor 115 is equal to the total supply voltage between terminal 182 and ground. The same static analysis applies to FIG. 2 as to FIG. 1.

A dynamic analysis of the circuit of FIG. 1 with the base electrode coupling condensers 161 to 16N connected to the supply source terminal 184 will now be given. Each of the primary windings 131 to 13N of the output transformer should have the same number of turns, and will therefore have the same induced voltage across them. As shown above, the collector currents of each of the transistors 121 to 12N may be assumed to be substantially equal, and the signal current supplied from source 111 to the several base electrodes are inversely proportional to the dynamic current gain factors Beta of the several transistors. For each transistor the signal voltage drop from the base electrode to the emitter electrode plus the signal voltage from the emitter electrode to ground must be equal to the signal voltage from terminal 184 to ground. The base-to-emitter component of this voltage should be substantially equal for each of the transistors. Therefore, the emitter-to-ground components will also be substantially equal. The emitter electrode of transistor 12N is at A.C. ground, supplied through the condenser 116. Therefore, each of the other emitter electrodes is at substantially A.C. ground, and each of the transistors may be considered as operating with its emitter electrode as an A.C. ground point.

Each transistor may be considered as having an equivalent circuit with an A.C. signal generator in its collector circuit and an A.C. signal load formed by the primary winding connected to its collector electrode. Thus, the transistors are effectively operated in parallel supplying output signal power from the secondary winding 118 to the load 112, and having the input also supplied in parallel from the signal source 111.

The output signal power from each transistor is equal to the product of the effective values of the A.C. voltage drop across the primary winding in its collector circuit and the effective value of the collector current. The power is also equal to one half of the peak values of this voltage and current. The signal voltage across each primary winding is the sum of a voltage drop produced by the transformer losses plus an induced voltage. Since all of the primary windings have the same number of turns, they all have the same value of induced voltage. The voltage produced by the losses is quite small compared to the induced voltage, and about equal for each of the windings. Therefore, since each of the primary windings has the same signal voltage and the same signal current, the output powers of the transistors are equal, regardless of the respective power gains of the transistors If the bias is adjusted so that the D.C. voltage drops across the transistors are substantially equal, and the amplifier is driven to have a peak signal voltage equal to this bias voltage in each transistor, then the A.C. power output will be one half of the direct-current power supplied. Therefore, the maximum efficiency is 50%.

It has been shown that the values of the base current supplied to the transistors is inversely proportional to the dynamic current gain thereof. Since all of the transistors are supplied with the same input voltage, the driving powers of the transistors are inversely proportional to their current gains. This may not appear to be logical. Since the transistors are parallel connected, and since their output powers are equal, it would seem that the power input would be inversely proportional to the power gains. However, it may be noted that the input voltage to the input circuit of each transistor has two components, the base-to-emitter signal voltage, and the emitter-to-ground signal voltage. Therefore, the input power may be divided into two corresponding components. The base-to-emitter component of this input power would represent the driving powers required by the transistors if they were completely independent from each other. These values are inversely proportional to the power gains of the transistors. However, if the transistors differ slightly, the base-to-emitter signal voltages may also differ slightly. Since the total base-to-ground voltage is the same for each of the transistors, the emitter-to-ground voltages must vary by the same amount as the base-to-emitter voltage. This signal voltage at the emitter electrode with respect to ground may be either in-phase or out-of-phase with the voltage at the base electrode with respect to ground. The emitter-to-ground component of the signal input represents a feedback which, according to its relative phase, is either regenerative or degenerative. This feedback is the result of the fact that each transistor sees at its emitter a current generator supplied by the next transistor.

For the dynamic analysis of the circuit of FIG. 2, the same considerations apply in determining the value of the signal currents in the transistors as in the circuit of FIG. 1. All of the transistors will have substantially the same signal current in the collector-emitter path, and the signal current to the base electrodes will be inversely proportional to their dynamic current gains Beta.

The signal input voltage for transistor 221 comprises components from the base to the emitter electrodes, in the primary winding 231, and from the collector of transistor 222 to ground. The sum of these components is equal to the signal voltage supplied between terminal 284 and ground. Similarly, each of the other transistors except the last has the input signal voltage divided into the three components. For the last transistor 22N, this input comprises the base-to-emitter voltage, and the voltage in winding 23N to ground at capacitor 216. Since each of the transistors has substantially the same base-to-emitter voltage drop, and the primary windings 231 to 23N have substantially the same signal voltage across them, and since the lower end of winding 23N is at ground potential, the collector electrodes of each of the transistors 222 to 22N will be at substantially ground potential. The collector electrode of transistor 221 is at A.C. ground through battery 210. Therefore, each of the transistors can be considered as operating in a grounded-collector configuration, in parallel for alternating current signals.

The same considerations as to output power, efficiency, and driving power apply as for the grounded-emitter configuration of FIG. 1. Thus, the transistors each supply substantially the same amount of output power, and the input driving power is inversely proportional to the dynamic current gain factor, Beta. If the transistors were operated independently, the input power would be determined by the input signal current supplied to the base electrode, and the input signal voltage from the base electrode to the lower end of the associated primary winding. This A.C. voltage comprises the base-to-emitter voltage plus that across the primary winding connected to the emitter electrode. The value of the input power is equal to one half the product of the peak values of this current and voltage. If the values of Beta vary, there may be some signal voltage between the lower end of the primary winding and ground for the transistors other than 22N. This signal voltage may be either in-phase or out-of-opposite-phase with respect to the base-to-ground signal, and thus represent either regenerative or degenerative feedback. However, because of the high amount of feedback which is characteristic of the emitter-follower connection, the additional feedback will be negligible.

In FIG. 1, an alternative embodiment of the grounded-emitter configuration may be obtained, corresponding to switch 114 in the ground position. Then input signal power is supplied from terminal 184 through coupling condenser 16N to the base electrode of transistor 12N only. The base electrode of the other transistors 121, 122, etc., are coupled to A.C. ground through the condensers 161, 162, etc. Then, in the input circuit of each transistor except the last, the base-to-emitter signal voltage plus the emitter-to-ground signal voltage would be zero; and in the input circuit of the last transistor 12N, the base-to-emitter signal voltage is equal to the input supply voltage between terminal 184 and ground. Then, if the transistors are substantially equivalent and have the same base-to-emitter signal voltage, each of the transistors except the last has between its emitter electrode and ground a signal voltage equal in magnitude and opposite in phase to the input signal voltage at terminal 184. This is equivalent to in-phase signal voltages between the base electrodes and ground. In effect, each of these transistors obtains its input signal power from the succeeding transistor. This input power taken by each transistor is very small compared to the output power it delivers to the load. Thus, the transistors still have substantially equal power outputs. However, the only input power required from the source 111 is that supplied to the transistor 12N. This is the same power as delivered to that transistor in the original configuration in which terminal 184 was coupled to the base electrodes of all the transistors. This, in effect, means that the power sensitivity has been increased by a factor equal to the number of transistors used.

Comparing the amplifier according to the invention as shown in FIGS. 1 and 2 to a conventional parallel circuit, an advantage is obtained in the uniform distribution of the output power among the transistors regardless of the current gain factor Beta of each of them. Also, with a supply voltage substantially higher in value than the maximum reverse voltage of each of the transistors, the efficiency is greatly increased since voltage dropping resistors are not required.

Figure 3:
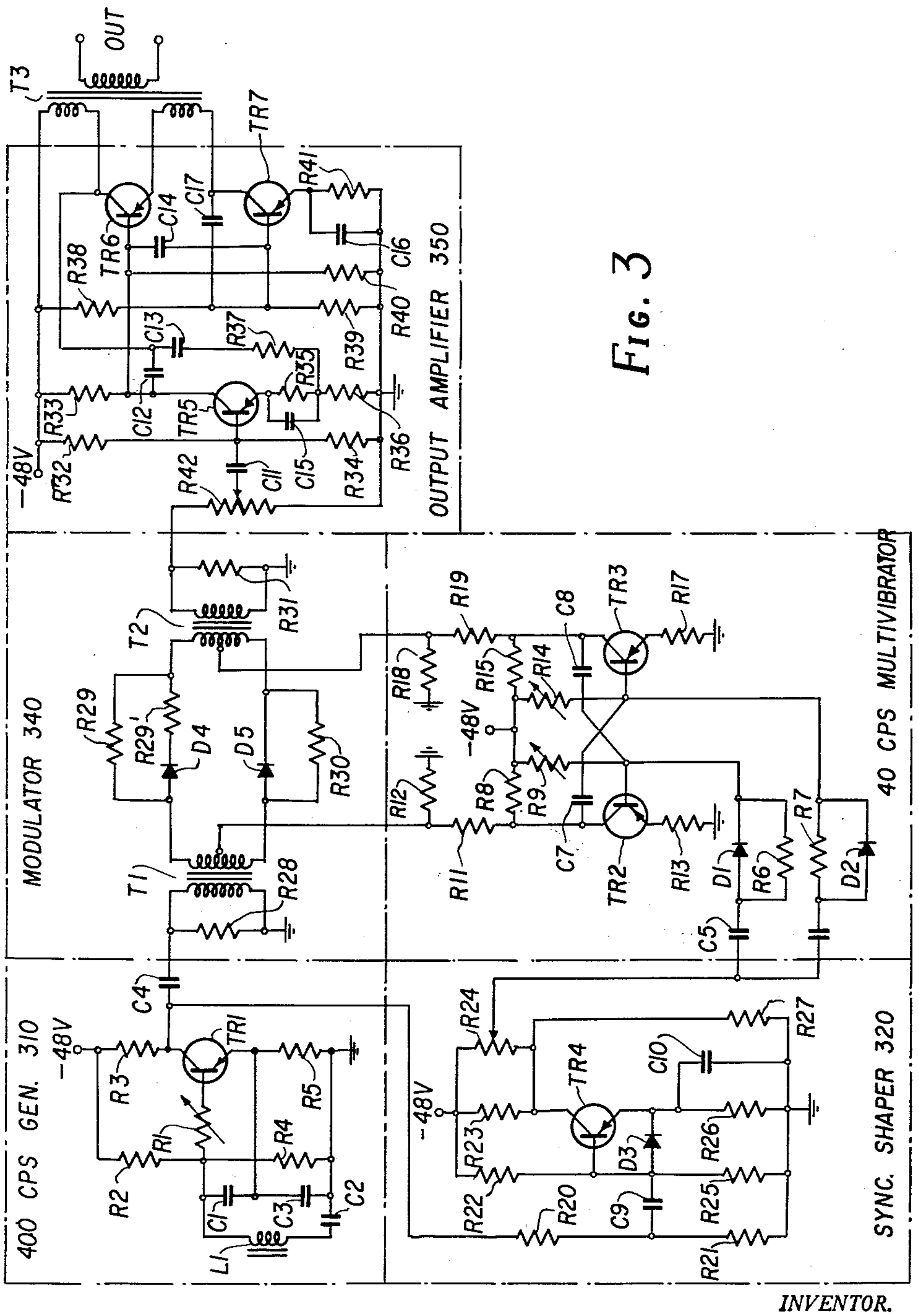
FIG. 3 is a schematic diagram of a complete tone generator and output amplifier.

FIG. 3 is a schematic diagram of a ringback tone generator for a telephone system. It comprises a 400 c.p.s. generator 310, a synchronism shaper 320, a 40 c.p.s. multivibrator 330, a modulator 340, and an output amplifier 350.

The 400 c.p.s. generator 310 is a sinewave oscillator of the Clapp type, using a transistor TR1. Resistor R1 in the base circuit is variable to permit the gain to be adjusted.

To achieve good modulation it is necessary that the multivibrator 330 trigger exactly when the 400 c.p.s. signal from oscillator 310 passes through zero. To accomplish this a synchronizing signal is derived from the output of the oscillator 310. This sinewave signal is converted to a square wave form by the synchronism shaper 320, which comprises transistor TR4 operating as an implifier-clipper. The diode D3 connected with reverse polarity across the base-emitter junction of the transistor TR4 stabilizes the operating bias point of the transistor. Output at an adjustable level is taken from the variable tap of resistor R24 in the collector circuit.

A 40 c.p.s. signal is obtained from the free-running symmetrical multivibrator 330. Resistors R9 and R14 are time constant controls. Resistors R13 and R17 give the multivibrator a proper input impedance. For synchronization the output from the synchronization shaper 320 is differentiated by the circuit comprising condenser C5, diode D1, and resistor R6; and also by the circuit comprising condenser C6, diode D2, and resistor R7. These networks differentiate the square wave and produce positive pulses. These pulses are applied respectively to the base electrodes of transistors TR2 and TR3. The resistor R24 of the synchronization shaper 320 is set so that the pulses applied to the base electrodes in the multivibrator are at the proper level to synchronize it at the desired frequency.

The modulator 340 is an electronic switch in a balanced symmetrical circuit. The diodes D4 and D5 are biased by the signal from the multivibrator 330 to be alternately conducting and non-conducting. These diodes, therefore, form a switch in the circuit between the transformers T1 and T2. According to a feature of the invention, the diodes are shunted respectively by resistors R29 and R30 to permit a reduced signal current flow during the non-conducting condition of the diodes. The 400 c.p.s. sinewave signal from the oscillator 310 is applied through coupling condenser C4 and transformer T1 to the switch circuit. From the switch this signal is coupled through transformer T2 to the output amplifier. During the interval when transistor TR2 is conducting and transistor TR3 is cut off, the diodes D4 and D5 are fully conducting and the 400 c.p.s. signal passes through them with very little attentuation; and during the interval in which transistor TR2 is cut off and transistor TR3 is conducting, the diodes D4 and D5 are substantially completely cut off and the signal flows only through the resistors R29 and R30. The 400 c.p.s. signal is thereby amplitude modulated with the coefficient of modulation depending upon the values of the resistors R29 and R30. This coefficient of modulation may be widely varied by adjusting the values of the resistors R29 and R30. The resistor R29′ is connected in series with one of the diodes to balance them more accurately.

The signal from the modulator is applied through the gain adjusting resistor R42 and coupling condenser C11 to the base electrode of transistor TR5, which comprises the first stage of the output amplifier 350. The final stage comprises transistors TR6 and TR7 in a grounded emitter configuration of the type disclosed in FIG. 1. Condenser C13 and resistors R36 and R37 form a feedback network which lowers the output impedance of the amplifier. Condenser C12 prevents high frequency oscillation.

In a specific embodiment of the circuit of FIG. 3, the diodes D1, D2, and D3 may be type 610C (Texas Instruments Company). Diodes D4 and D5 may be type 1N91, and should be matched. The transistors TR1, TR2, TR3, and TR4 may be type 2N362, and the transistors TR5, TR6, and TR7 may be type 2N43. The resistors and condensers may have values as follows:

*Resistors*

| | Ohms | | Ohms |
|---|---|---|---|
| R1 | 100,000 | R23 | 10,000 |
| R2 | 82,000 | R24 | 10,000 |
| R3 | 5,600 | R25 | 47,000 |
| R4 | 27,000 | R26 | 3,900 |
| R5 | 3,900 | R27 | 5,600 |
| R6 | 330,000 | R28 | 10,000 |
| R7 | 330,000 | R29 | 12,000 |
| R8 | 15,000 | R30 | 12,000 |
| R9 | 580,000 | R31 | 1,000 |
| R11 | 2,700 | R32 | 47,000 |
| R12 | 1,500 | R33 | 5,600 |
| R13 | 390,000 | R34 | 33,000 |
| R14 | 580,000 | R35 | 12,000 |
| R15 | 15,000 | R36 | 180 |
| R17 | 390,000 | R37 | 2,700 |
| R18 | 1,500 | R38 | 15,000 |
| R19 | 2,700 | R39 | 10,000 |
| R20 | 3,900 | R40 | 47,000 |
| R21 | 1,800 | R41 | 1,800 |
| R22 | 68,000 | R42 | 10,000 |

*Condensers*

| | Microfarads | | Microfarads |
|---|---|---|---|
| C1 | 0.1 | C10 | 50 |
| C2 | 0.03 | C11 | 10 |
| C3 | 1 | C12 | 0.0002 |
| C4 | 2 | C13 | 10 |
| C5 | 0.0005 | C14 | 10 |
| C6 | 0.0005 | C15 | 100 |
| C7 | 0.2 | C16 | 50 |
| C8 | 0.2 | C17 | 0.0002 |
| C9 | 1 | C18 | 0.0002 |

Figure 4:
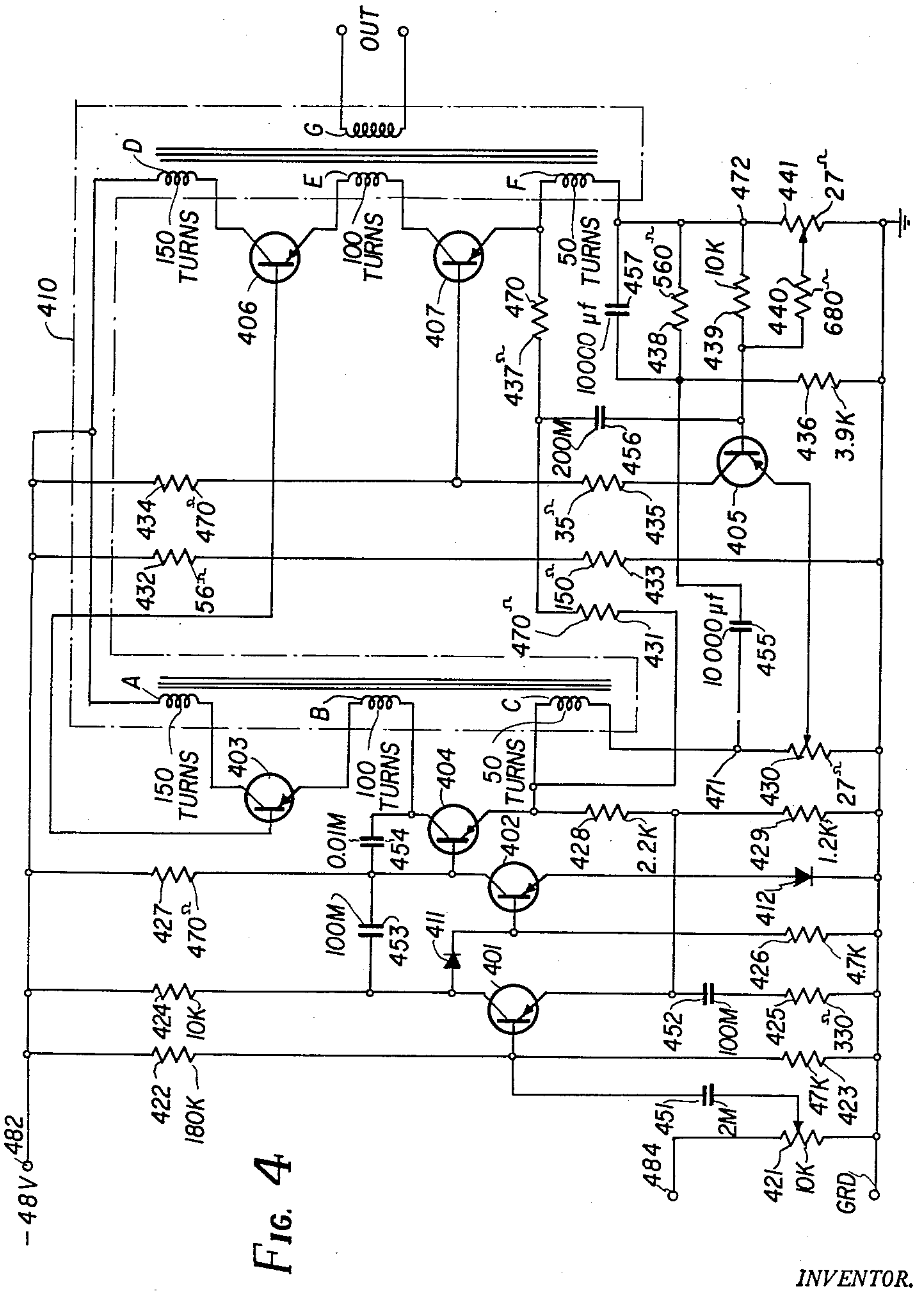
FIG. 4 is a schematic diagram including a push-pull amplifier according to the invention.

In FIG. 4 an amplifier is shown which includes a push-pull class A stage using the principle of operating transistors in series for D.C. bias and in parallel for A.C. signals. It may be used in place of the amplifier 350 in tone generator of FIG. 3.

The input signal at terminal 484 is introduced through the gain-control resistor 421 and the coupling capacitor 451 to the base electrode of transistor 401, the collector electrode of which is D.C. coupled, through the voltage divider made up of the Zener diode 411 and the resistor 426, to the base electrode of transistor 402. The collector electrode of transistor 402 is directly coupled to the base electrode of transistor 404. A Zener diode 412 is also used between the emitter electrode of transistor 402 and ground. Diodes 411 and 412 could obviously be replaced by appropraite resistors by-passed by capacitors. Their use assures an essentially zero phase shift at low frequency.

The network of resistors 428 and 429 supplies D.C. feedback and stabilizes the operating bias points of the transistors against the tolerances of cut-off current and the static characteristics. The network of resistors 428, 429, and 425 supplies A.C. feedback. Condensers 453 and 454 act as stabilizers against high frequency oscillations.

The final stage comprises four transistors 403, 404, 406, and 407, and an output transformer having six primary windings A to F and a secondary winding G. An arrangement similar to that of FIG. 1 with switch 114 in the ground position is used here. The amplifying stage comprises two series emitter-collector D.C.-bias-current paths in parallel between the supply terminal 482 and ground; one through winding A, transistor 403, winding B, transistor 404, winding C and stabilizing resistor 430; and the other through winding D, transistor 406, winding E, transistor 407, winding F and stabilizing resistor 441. In each path both the D.C. bias and the A.C. signal current will have substantially the same value throughout the path, as in FIGS. 1 and 2.

Transistors 404 and 407 from a push-pull pair, delivering signal output to windings B and E connected to the respective collector electrodes and windings C and F connected to the respective emitter electrodes. Transistor 403 is driven at its emitter electrode by the output signal current from the collector electrode of transistor 404 through winding B; and transistor 406 is driven at its emitter electrode by current from transistor 407 through winding E. Thus, transistors 403 and 406 also form a push-pull pair, with the base electrodes connected to a common point 470 of the biasing voltage divider comprising resistors 432 and 433.

On the output transformer 410, windings A and D each have 150 turns, windings B and E each have 100 turns, and windings C and F each have 50 turns. Thus, the number of turns on the output winding A of transistor 403 equals the total number of turns on the windings B and C in the output circuit of transistor 404, and also equals the number of turns on winding D for transistor 406, and the sum of the number of turns on windings E and F for transistor 407. Therefore each transistor supplies one-fourth of the output power. Transistor 403 operates in parallel with transistor 404, and transistor 406 in parallel with transistor 407, for A.C. signal output.

With the input signals amplified by transistors 401 and 402 and applied to the base electrode of transistor 404, output signal current flows in windings A, B, and C. For purposes of explanation, assume that transistor 407 is not driven. In this case there would be a considerable signal potential at the points 471 and 472 of the emitter stabilizing resistors 430 and 441 respectively, these points being connected together for A.C. signals through the capacitors 455 and 457. Consequently the A.C. voltages at the emitter electrodes of transistors 404 and 407 would be different, as far as the amplitude is concerned, whereas the A.C. voltages across the windings C and F would be equal and opposite, and there would be a significant unbalance A.C. voltage at the junction of the two equal resistors 431 and 437.

This unbalance voltage is applied through the amplifier comprising transistor 405 to the base electrode of transistor 407. Transistor 407 is consequently driven and causes a current almost equal and opposite to the emitter current of transistor 404 to flow through the parallel resistors 430 and 441. Consequently, the voltage at the terminals 471 and 472 is reduced to a negligible amount, the voltages at the emitter electrodes of transistors 404 and 407 are practically equal and opposite, and the push-pull of transistors 404 and 407 is accurately balanced. The upper push-pull of transistors 403 and 406 is also accurately balanced, and the bias point 470 does not require a bypass capacitor.

The resistors 439 and 440 adjust the voltage at the base electrode of transistor 405. Otherwise the base-to-emitter voltage drop of transistor 405 would impair the D.C. balance of the push-pull arrangement. The resistors 438 and 436 provide a small bias for the electrolytic capacitors 455 and 457. Resistor 435 limits the transients when the power supply is applied.

The complete amplifier has a high input impedance at terminal 484 to ground. Therefore, two or more amplifiers may be connected across the output of modulator 340 (FIG. 3) without impairing its performance.

The transistors used in this amplifier may be type 2N301A. Suitable values for the resistors and condensers are indicated on the drawing.

The transistor tone generator disclosed in FIGURE 3 of this application is claimed in a copending divisional application, Serial No. 863,225, filed December 31, 1959.

While I have described above the principles of my invention in connection with specific apparatus, it is to be clearly understood that this description is made only by way of example and not as a limitation to the scope of my invention.

What is claimed is:

1. A transistor amplifier comprising a plurality of transistors including a first one and a last one, each having emitter, base, and collector electrodes with an internal emitter-collector path, an output transformer having a plurality of primary windings and a secondary winding for coupling output signal power to a load, a source of direct current supplied between a supply point and a reference point; the emitter-collector paths of said transistors being connected in series between the supply point and the reference point, with the emitter electrode of each transistor except the last connected through one of the primary windings to the collector electrode of the succeeding transistor, said series connection also including a first end connection from the collector electrode of the first transistor to the supply point and a second end connection from the emitter electrode of the last transistor to the reference point, one of said end connections including another one of the primary windings; means for supplying direct-current bias to each of the base electrodes, and means for coupling a source of input signals to the base electrode of at least one of said transistors; whereby for supplying output signal power to said load said transistors are effectively in parallel.

2. A transistor amplifier according to claim 1, in which said source of input signals is coupled in parallel to the base electrodes of all of said plurality of transistors.

3. A transistor amplifier according to claim 1, in which said means for supplying direct-current bias to each of the base electrodes comprises a separate voltage divider across said source of direct current for each said base electrode.

4. A transistor amplifier according to claim 1, wherein said second end connection includes a stabilizing resistor bypassed by a capacitor having low impedance to the alternating current signals.

5. A transistor amplifier according to claim 4, in which said other primary winding is included in said first end connection.

6. A transistor amplifier according to claim 5, in which only the base electrode of said last transistor is coupled to the source of input signals, and the base electrodes of the other transistors are effectively brought to the alternating current potential of said reference point.

7. A transistor amplifier according to claim 4, in which said other primary winding is included in said second end connection.

8. A transistor amplifier according to claim 1, in which each of said end connections includes a winding of said plurality of primary windings, the primary winding in the first end connection having N turns, and the sum of the number of turns in the winding in the second end connection and the number of turns in the winding connecting the collector electrode of the last transistor to the emitter electrode of the preceding transistor being equal to N.

9. A transistor amplifier according to claim 1, further comprising a second plurality of transistors and a second plurality of primary windings on said output transformer, a second series connection between the supply point and the reference point including the emitter-collector paths of the second transistors and the second primary windings similar to said series connection of the first transistors and first primary windings; and means for coupling said source of input signals to the two pluralities of transistors so arranged that the driving power supplied to the second plurality of transistors is substantially 180° out of phase with respect to the driving power supplied to the first plurality of transistors, thereby causing the output power from the two pluralities of transistors to be supplied to said secondary winding in phase.

References Cited in the file of this patent

UNITED STATES PATENTS

| | | |
|---|---|---|
| 2,239,773 | Bierwirth | Apr. 29, 1941 |
| 2,815,408 | Hafler | Dec. 3, 1957 |
| 2,846,583 | Goldfischer et al. | Aug. 5, 1958 |
| 2,846,584 | Hurst | Aug. 5, 1958 |
| 2,850,631 | Tillman | Sept. 2, 1958 |
| 2,863,956 | Schmidt | Dec. 9, 1958 |
| 2,875,284 | Ehret | Feb. 24, 1959 |
| 2,879,412 | Hoge et al. | Mar. 24, 1959 |
| 2,888,525 | Eckess et al. | May 26, 1959 |